United States Patent
Chen et al.

(10) Patent No.: US 8,816,249 B2
(45) Date of Patent: Aug. 26, 2014

(54) APPARATUSES FOR FABRICATING PATTERNS USING LASER DIODE

(75) Inventors: Ying-Chi Chen, Hsinchu County (TW); Rung-Ywan Tsai, Taipei (TW); Golden Tiao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 707 days.

(21) Appl. No.: 13/095,815

(22) Filed: Apr. 27, 2011

(65) Prior Publication Data

US 2011/0259856 A1 Oct. 27, 2011

Related U.S. Application Data

(63) Continuation-in-part of application No. 12/617,679, filed on Nov. 12, 2009, now Pat. No. 8,304,688.

(60) Provisional application No. 61/345,325, filed on May 17, 2010, provisional application No. 61/173,578, filed on Apr. 28, 2009.

(30) Foreign Application Priority Data

| Aug. 31, 2009 | (TW) | ................................ 98129223 A |
| Nov. 18, 2010 | (TW) | ................................ 99139694 A |

(51) Int. Cl.
| *B23K 26/08* | (2014.01) |
| *B23K 26/06* | (2014.01) |
| *H01S 5/22* | (2006.01) |
| *G03F 7/20* | (2006.01) |
| *H01S 5/022* | (2006.01) |

(52) U.S. Cl.
CPC .......... *B23K 26/083* (2013.01); *B23K 26/0656* (2013.01); *B23K 26/0648* (2013.01); *B23K 26/0608* (2013.01); *G03F 7/70383* (2013.01); *H01S 5/02236* (2013.01)
USPC ............... 219/121.73; 219/121.76; 372/43.01

(58) Field of Classification Search
USPC ............. 219/121.68, 121.73, 121.75, 121.76; 372/43.01

See application file for complete search history.

(56) References Cited

U.S. PATENT DOCUMENTS

| 4,842,677 | A | * | 6/1989 | Wojnarowski et al. | .. 219/121.69 |
| 5,148,319 | A | * | 9/1992 | Gratrix et al. | ................. 359/642 |
| 5,609,780 | A | * | 3/1997 | Freedenberg et al. | ... 219/121.73 |
| 5,910,260 | A | * | 6/1999 | Gerber | ..................... 219/121.67 |

(Continued)

FOREIGN PATENT DOCUMENTS

| JP | 6-232508 A | * | 8/1994 |
| TW | 486402 | | 5/2002 |

(Continued)

OTHER PUBLICATIONS

Machine translation of Japan Patent document No. 6-232,508-A, Jan. 2014.*

(Continued)

*Primary Examiner* — Geoffrey S Evans (57) ABSTRACT

An apparatus for fabricating patterns using a laser diode is presented. The apparatus includes at least one laser diode, at least one lens and a mask having at least one pin hole, wherein light emitted from the laser diode is emitted through the lens and the pin hole to be focused on a first material layer.

25 Claims, 12 Drawing Sheets

(56) References Cited

U.S. PATENT DOCUMENTS

| | | |
|---|---|---|
| 6,205,160 B1 * | 3/2001 | Grewell .......................... 372/36 |
| 6,498,679 B2 | 12/2002 | Lee et al. |
| 6,856,634 B2 * | 2/2005 | Mikame .................... 372/43.01 |
| 7,307,722 B2 | 12/2007 | Martinelli et al. |
| 2003/0099267 A1 * | 5/2003 | Hennig et al. .................. 372/36 |
| 2003/0169502 A1 * | 9/2003 | Ogura ............................ 359/618 |
| 2004/0124184 A1 * | 7/2004 | An et al. ..................... 219/121.8 |
| 2008/0019010 A1 * | 1/2008 | Govorkov et al. ............. 359/641 |
| 2008/0055702 A1 * | 3/2008 | Ferrari ........................... 359/279 |
| 2009/0086170 A1 * | 4/2009 | El-Ghoroury et al. .......... 353/38 |
| 2010/0103544 A1 * | 4/2010 | Vethake et al. ............... 359/850 |
| 2010/0103973 A1 * | 4/2010 | Bonna et al. ............... 372/50.12 |
| 2010/0158058 A1 * | 6/2010 | Kress ............................. 372/35 |

FOREIGN PATENT DOCUMENTS

| | | |
|---|---|---|
| TW | 200739694 A | 10/2007 |
| TW | 200829359 A | 7/2008 |
| WO | WO-2008/145713 A * | 12/2008 |

OTHER PUBLICATIONS

Taiwan Patent Office, Office Action, Patent Application Serial No. 099139694, Jan. 15, 2013, Taiwan.

Taiwan Patent Office, Office Action, U.S. Appl. No. 99/139,694, Jun. 24, 2013, Taiwan.

* cited by examiner

APPARATUSES FOR FABRICATING PATTERNS USING LASER DIODE

CROSS REFERENCE TO RELATED APPLICATIONS

This application is a Continuation-In-Part of application Ser. No. 12/617,679, filed on Nov. 12, 2009, now U.S. Pat. No. 8,304,688, which claims the benefit of U.S. Provisional Application No. 61/173,578, filed on Apr. 28, 2009, and claims the priority of Taiwan Patent Application No. 098129223, filed on Aug. 31, 2009, the entirety of which are incorporated by reference herein, and further claims the benefit of U.S. Provisional Application 61/345,325, filed on May 17, 2010 and the priority of Taiwan Patent Application No. 099139694, filed on Nov. 18, 2010.

This application claims the benefit of U.S. Provisional Application No. 61/345,325, filed on May 17, 2010, the entirety of which is incorporated by reference herein.

This application is based upon and claims the benefit of priority from a prior Taiwan Patent Application No. 099139694, filed on Nov. 18, 2010, the entirety of which is incorporated herein by reference.

BACKGROUND OF THE INVENTION

1. Field of the Invention

The disclosure relates to laser diode fabrication apparatuses, and in particular, to apparatuses for fabricating patterns using a laser diode and methods for fabricating patterns.

2. Description of the Related Art

Fabrication of large-sized and flexible display panels use conventional processes such as lithography, laser processing, inkjet printing, and thermal print head printing, for mass production in applications of micro patterns, for example, micro phase retardation films (retarders).

Conventional lithography is beneficial due to the fact that it's well-developed. The requirement that a predetermined mask must be used to define a width of a retardation on a micro retarder. High power (about 100 Watt (W)) $CO_2$ laser processing is advantageous due to the fact that it can be practically used. A pattern fabricated by high power $CO_2$ laser processing is created by several laser-scanning lines such that fine traces are left between the laser-scanning lines. As for inkjet printing, inkjet printing is beneficial due to low production costs. Inkjet droplets, however, are difficult to apply on some materials.

The micro phase retardation plate of a conventional phase retarder structure includes two regions with different phase retardations. Alternative regions with different phase retardation can be formed by a $CO_2$ laser heating treatment. U.S. Pat. No. 6,498,679, the entirety of which is hereby incorporated by reference, discloses a fabrication method for patterning phase retardation using a $CO_2$ laser heating. Patterns with different phase retardation characteristics are formed by laser scanning line by line. Several laser-scanning lines are composed on a patterned region.

BRIEF SUMMARY OF INVENTION

An exemplary embodiment of an apparatus for fabricating patterns using a laser diode includes at least one laser diode, at least one lens and a mask having at least one pin hole, wherein light emitted from the laser diode is through the lens and the pin hole to be focused on a first material layer.

Another exemplary embodiment of an apparatus for fabricating patterns using a laser diode includes at least one laser diode and at least one lens, wherein light emitted from the laser diode is focused by the lens onto a first material layer, and wherein the first material layer is disposed on a stack composed by a second material layer as a top layer, a third material layer as a middle layer and a fourth material layer as a bottom layer.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION OF INVENTION

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation method for a first feature over or onto a second feature in the description that follows may include embodiments in which the first and second features are formed in direct contact or not in direct contact.

Some embodiments provide an apparatus for fabricating or processing patterns using a laser diode of the disclosure. Specifically, a low power laser diode array can be applied to the fabrication of patterns due to its small volume and low production cost. Embodiments of an apparatus for fabricating patterns may use a mask with a pin hole incorporated with a laser absorption layer disposed on a film to be patterned, so that a diameter and intensity of light emitted from the laser diode is well controlled. Also, the light with a controlled diameter is focused onto the laser absorption layer, and the laser absorption layer is used to indirectly heat the film to be patterned to form patterns. So, a width of the patterns is under precise control. Additionally, embodiments of an apparatus for fabricating patterns using a laser diode may incorporate a laser absorption layer disposed on a film to be patterned to directly form a phase retardation film on a display panel or a polarizer of a display panel.

Figure 1A:
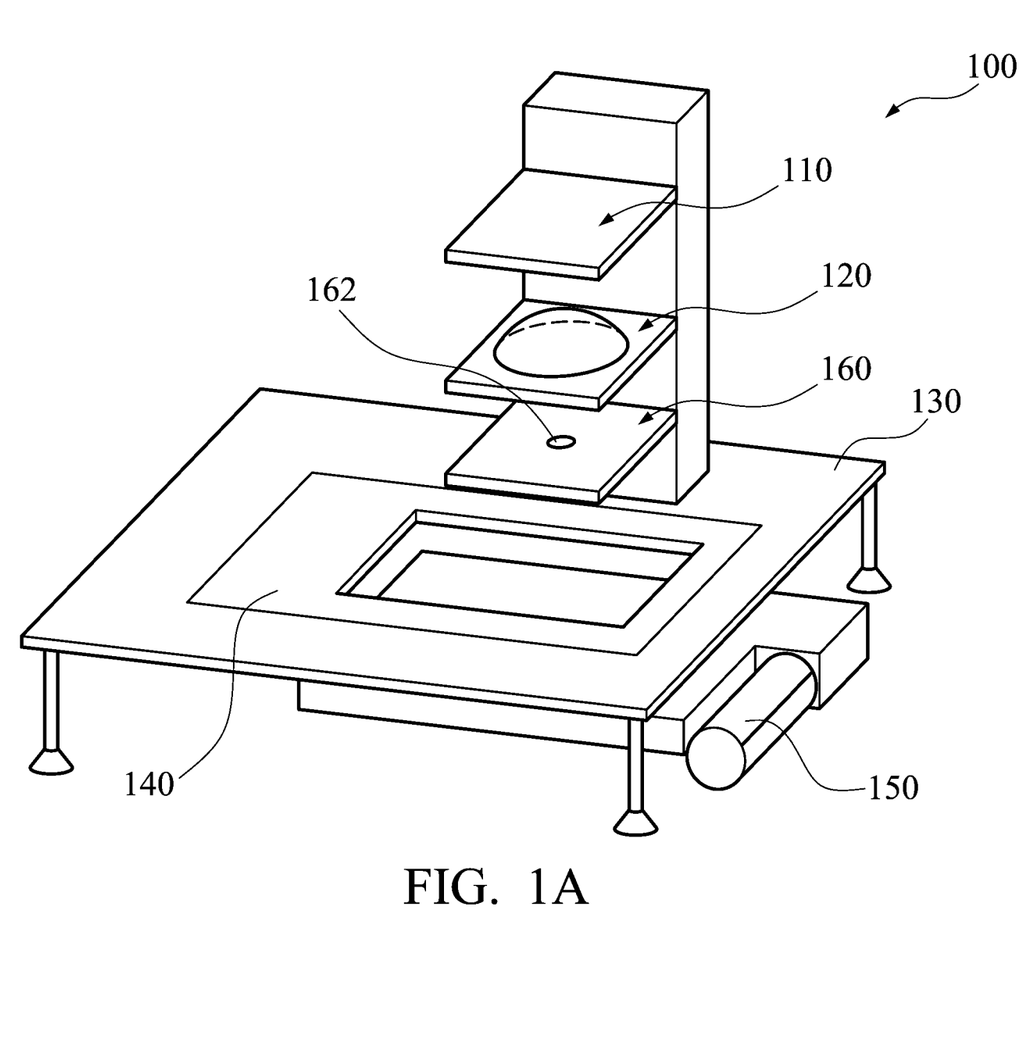
FIG. 1A is a schematic view of one embodiment of an apparatus for fabricating patterns using a laser diode of the disclosure.

FIG. 1A is a schematic view of one embodiment of an apparatus 100 for fabricating patterns using a laser diode. Referring to FIG. 1A, an apparatus 100 for fabricating patterns using a laser diode includes a laser diode array 110, a lens 120 and a mask 160. In one embodiment, the laser diode array 110 may have at least one laser diode. In one embodiment, the lens 120 may comprise a convex lens, wherein the light emitted from each laser diode is focused by the lens 120. In one embodiment, the mask 160 may have at least one pin hole 162. According to one embodiment, the laser diode array 110 is composed by a single laser diode or a multiple of laser diodes is set up to a support frame and is fixed to a base stage 130. A working piece 140 such as a desired patterned flexible plate includes a first material layer disposed on a second material layer. The working piece 140 is disposed on the base stage 130 or a control platform. A precision bearings motor 150 is adopted to precisely control a driving shaft and driving movement of the first and second material layers. In one embodiment, the driving shaft is used to regulate moving speed of the first and second material layers.

Figure 1B:
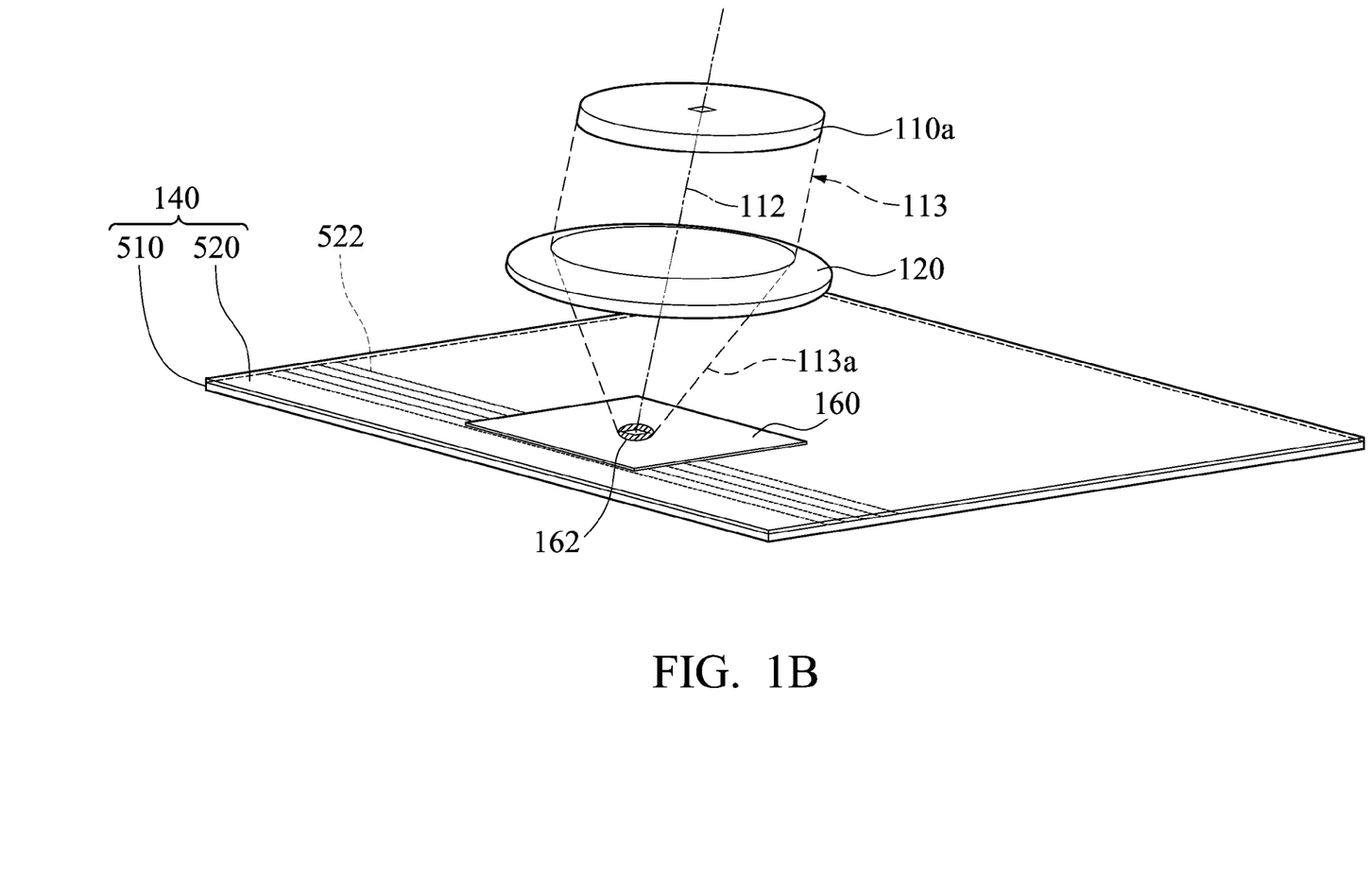
FIG. 1B is a schematic view of one embodiment of a method for fabricating patterns using a laser diode of the disclosure.

FIG. 1B is a schematic view of one embodiment of a method for fabricating patterns using a laser diode of the disclosure. Referring to FIG. 1B, during the fabrication of the patterns, a laser diode 110a may emit a light 113 having an optical axis 112. The lens 120 and the pin hole 162 of the mask 160 are located on the optical axis 112 of the laser diode 110a. That is to say, the laser diode 110a, the lens 120 and the pin hole 162 are aligned with the same axis and the same center, so that the light 113 emitted from the laser diode 110a is through the lens 120 and the pin hole 162 of the mask 160 sequentially to focus on a first material layer 520 disposed on a second material layer 510 to fabricate the patterns 522 on the second material layer 510. The principle for fabricating the patterns is described by the following description of FIGS. 5A and 5B.

Figure 5A:
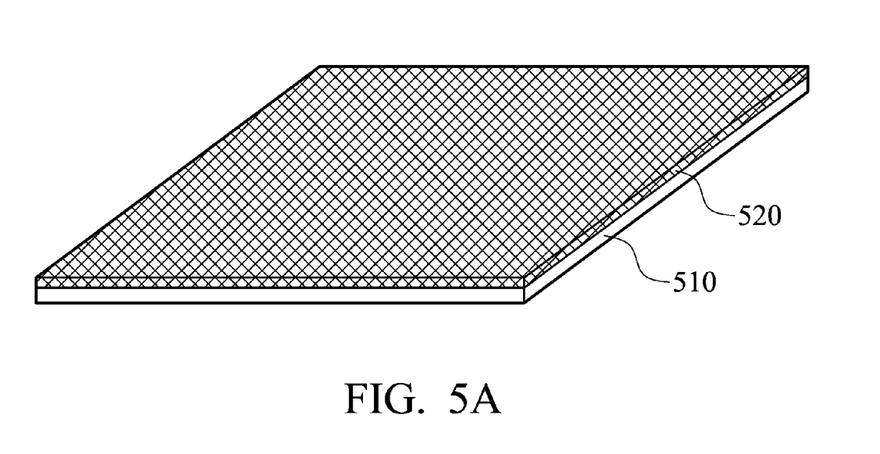
FIGS. 5A and 5B are schematic views illustrating one embodiment of the working pieces structures of the disclosure.
Figure 5B:
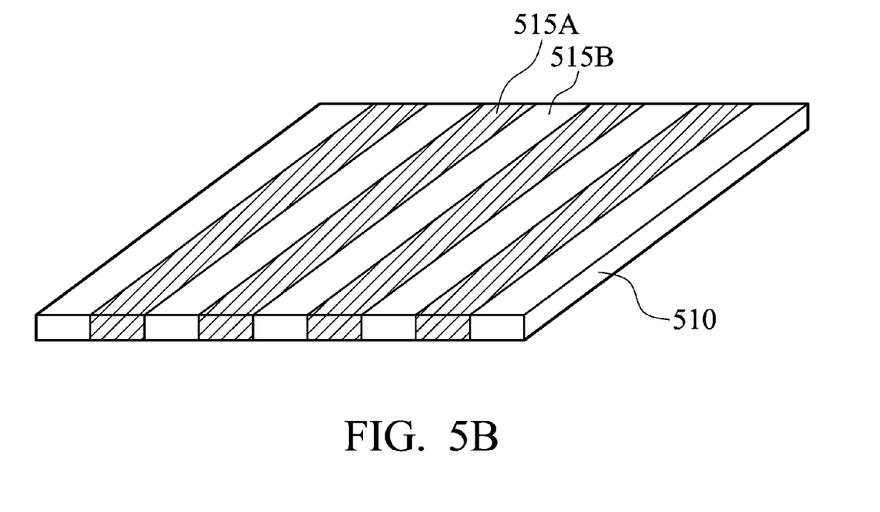

FIGS. 5A and 5B are schematic views of one embodiment of the working pieces structures to illustrate the principle for fabricating the patterns. As shown in FIG. 5A, the working pieces for processing patterns thereon using the laser diode array includes the first material layer 520 and the second material layer 510, wherein the first material layer 520 is disposed on the second material layer 510. In one embodiment, the first material layer 520 can be a laser absorption layer, and the second material layer 510 can be a film on which a micro pattern is desirably formed. The first material layer 520 may absorb a laser light having a wavelength between near infrared (IR) light and visible light. In one embodiment, the first material layer 520 may comprise a dye-containing layer, for example, a perchlorate dye-containing layer. The first material layer may have a thickness of between about 500 Å and 2000 Å, for example, 1000 Å. As shown in FIG. 5B, during the fabrication of the patterns, the laser diode 110a as shown in FIG. 1B is used to emit the light 113, and the light 113 is emitted sequentially through the lens 120 and the pin hole 162 to irradiate on a first material layer 520 (such as a laser absorption layer). A generated heat energy of the first material layer 520g by absorbing the light 113 may indirectly heat the second material layer 510 (such as a phase retardation film) underlying the first material layer 520, so that the second material layer 510 itself may have a phase change to periodically form alternate patterns 515A and 515B with different phase retardations (the patterns 515A and 515B have different phase to each other). Finally, the first material layer 520 is removed.

Figure 1C:
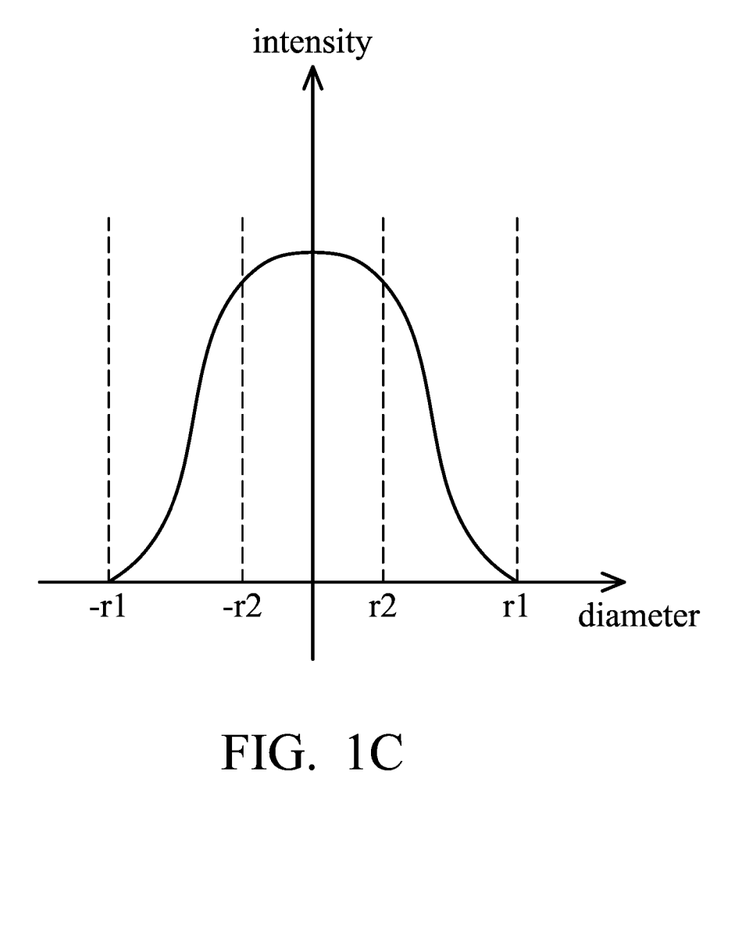
FIG. 1C is a schematic diagram showing light intensity of a light emitted from one embodiment of a laser diode of the disclosure, illustrating a relationship between a size of a light beam and a size of a hole.

FIG. 1C is a schematic diagram showing light intensity of a light 113a emitted from one embodiment of a laser diode of the disclosure, illustrating a relationship between a diameter of a light beam and a diameter of a pin hole. Because the light 113 emitted from the laser diode 110a as shown in FIG. 1B is focused by the lens 120 and irradiated on the mask 160 to form a light 113a, the light intensity of the light 113a may normally have a Gauss distribution as shown in FIG. 1C. The light intensity of a central portion of the light 113a is larger than that of a peripheral portion of the light 113a, thereby resulting in a non-uniform light intensity distribution phenomenon of the light 113a. During the fabrication of the patterns, especially during the fabrication of the phase retardation film of a three-dimensional liquid crystal display (3D LCD), the non-uniform light intensity distribution phenomenon of the light 113a may cause a poor contrast problem for the patterns. Therefore, the apparatus 100 for fabricating patterns using a laser diode utilizes the mask 160 having the pin hole 162, wherein a diameter of the pin hole 162 is designed smaller than that of the light 113 emitted from the laser diode 110 to block the peripheral portion of the light 113a with a lower light intensity and to retain the central portion of the light 113a with a higher light intensity. As shown in FIG. 1C, light 113 emitted from the laser diode 110 has a Gauss distribution, wherein a diameter of the light 113 is illustrated as 2r1 (a radius of the light 113 is illustrated as r1), and a diameter of the pin hole 162 of the mask 160 is illustrated as 2r2 (a radius of the pin hole 162 is illustrated as r2), and wherein r2 is smaller than r1. Accordingly, when a phase retardation film is processed by using a laser diode (the phase retardation film comprises a laser absorption film disposed thereon), only a portion of the light 113a with a higher light intensity may pass through the pin hole 162 of the mask 160. Therefore, the micro retardation (micro patterns) fabricated on the phase retardation film may have a more uniform distribution, to improve a display quality of a 3D display. In one embodiment, the mask 160 is disposed between the lens 120 and the working piece 140 (see FIG. 1B). Also, the mask 160 may be disposed as closely to the first material layer 520 as possible, for example, a distance between the mask 160 and the first material layer 520 is less than a distance between the mask 160 and the lens 120, so that the diameter and intensity of the light 113 may be well controlled. Additionally, the pin hole of the mask may control a width of micro retardation patterns during the fabrication of the phase retardation film. Therefore, during the fabrication of 3D LCDs, for example, a 17" (inch), 19" (inch), 42" (inch) LCD and larger sized LCD, only the diameter of the pin hole of the mask is required to be adjusted, and a 3D LCD can be fabricated by the mask which was arranged with an X-Y-Z axis micro gauge platform of the apparatus for fabricating patterns using a laser diode. The phase retardation film fabricated by one embodiment of a method for fabricating patterns using a laser diode has advantages of uniform distribution of the micro phase retardation patterns and high contrast display quality. For mass production of the phase retardation films, one embodiment of a method for fabricating patterns using a laser diode can save time and cost, thereby being a competitive technological advantage.

Figure 1D:
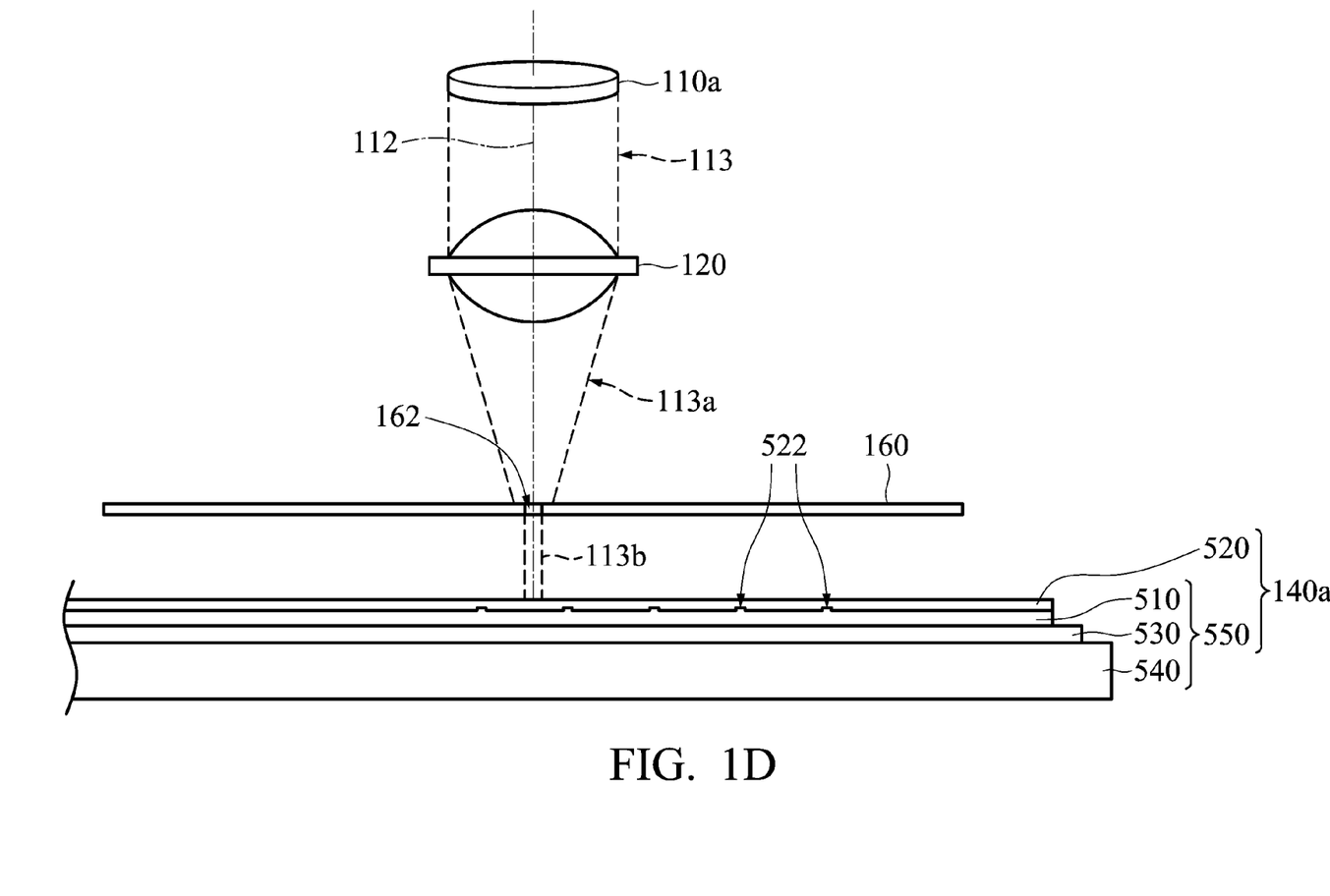
FIG. 1D is a schematic view of another embodiment of an apparatus for fabricating patterns using a laser diode of the disclosure.

One embodiment of an apparatus for fabricating patterns using a laser diode may incorporate a laser absorption film, which is disposed on a film on which a micro pattern is desirably formed, to directly fabricate a phase retardation film on a polarizer or a display panel. FIG. 1D is a schematic view of another embodiment of an apparatus for fabricating patterns using a laser diode of the disclosure. A light 113 emitted from a laser diode 110a is emitted through a lens 120 to form a light 113a, and then the light 113a is emitted through a pin hole 162 of a mask 160 to form a light 113b focused onto a first material layer 520, wherein the first material layer is disposed on a stack 550 composed by a second material layer 510 as a top layer, a third material layer 530 as a middle layer and a fourth material layer 540 as a bottom layer. In one embodiment, the second material layer 510 may be glued onto or electrostatically attached to a third material layer 530. Alternatively, if the first material layer 520 is a dye-containing layer, the first material layer 520 is directly formed on the first material layer by a coating or immersion method. In one embodiment, the first material layer 520 can be a laser absorption layer 520 (such as a dye-containing layer), the second material layer 510 can be a film on which a micro pattern is desirably formed (such as a phase retardation film 510), the third material layer 530 can be a polarizer 530, and the fourth material layer 540 can be a display panel 540 (such as a liquid crystal display (LCD)). For example, during the fabrication of the phase retardation film, one embodiment of an apparatus for fabricating patterns using a laser diode may take advantages of the laser diode. That is to say, one embodiment of an apparatus for fabricating patterns may utilize a low power (1.5 watt or 3 watt) light source arranged with a laser absorption layer, which is used to absorb a light emitted from the laser diode, to indirectly heat the phase retardation film. Therefore, during the fabrication of the phase retardation film, the polarizer 530 can be attached onto the LCD panel 540, and then the phase retardation film 510 can be attached onto the polarizer 530, thereby forming the stack 550. The laser absorption layer 520, which can absorb light to transform heat, is disposed on the phase retardation film 510 by a coating method. The laser absorption layer 520, the phase retardation film 510, the polarizer 530 and the LCD panel 540 may collectively serve as a working piece 140a. When the LCD panel 540 is lighted on, a charge coupled device (CCD) can be used to observe a width of a resolution line and a position of a pixel pitch of the LCD panel 540. Next, the diameter of the light emitted from the laser diode is adjusted by passing through the pin hole 162 of the mask 160 to form patterns 522 on the phase retardation film 510. A width and positions of the patterns 522 may be adjusted to correspond to the width and the positions of the resolution line width and the pixel pitch (such as 190 μm to 550 μm and defined by the resolution of the LCD panel) on the LCD panel 540. Therefore, time and cost for alignment between the phase retardation film 510 and the polarizer 530 during the conventional process can be eliminated, and the fabrication yield is improved. Additionally, during the conventional process, when the laser light is directly focused onto the phase retardation film to fabricate the patterns, the heat generated from the laser light may penetrate the phase retardation film and be transmitted to the polarizer, so that the polarizer is damaged because the high temperature endurance of the polarizer is usually worse than the phase retardation film. As shown in FIG. 1D, embodiments of the disclosure use the laser absorption layer 520 disposed on the phase retardation film 510 to prevent the polarizer from being damaged. When the light 113 emitted from the laser diode is focused onto the laser absorption layer 520, the grater part of the light 113 is absorbed by the laser absorption layer 520, so that the polarizer damage problem is dramatically reduced or eliminated. The fabrication yield is dramatically improved. Alternatively, a cholesteric liquid crystal plate may be used as the third material layer 530. Therefore, during the method for fabricating patterns, heat generated from the laser light may penetrate the laser absorption layer 520 and the phase retardation film 510 and then be transmitted to the cholesteric liquid crystal plate (530), so that the cholesteric liquid crystal plate (530) itself may have a phase change. After finishing the method for fabricating patterns, the cholesteric liquid crystal plate having phase differences may serve as a polarizer 530.

Figure 1E:
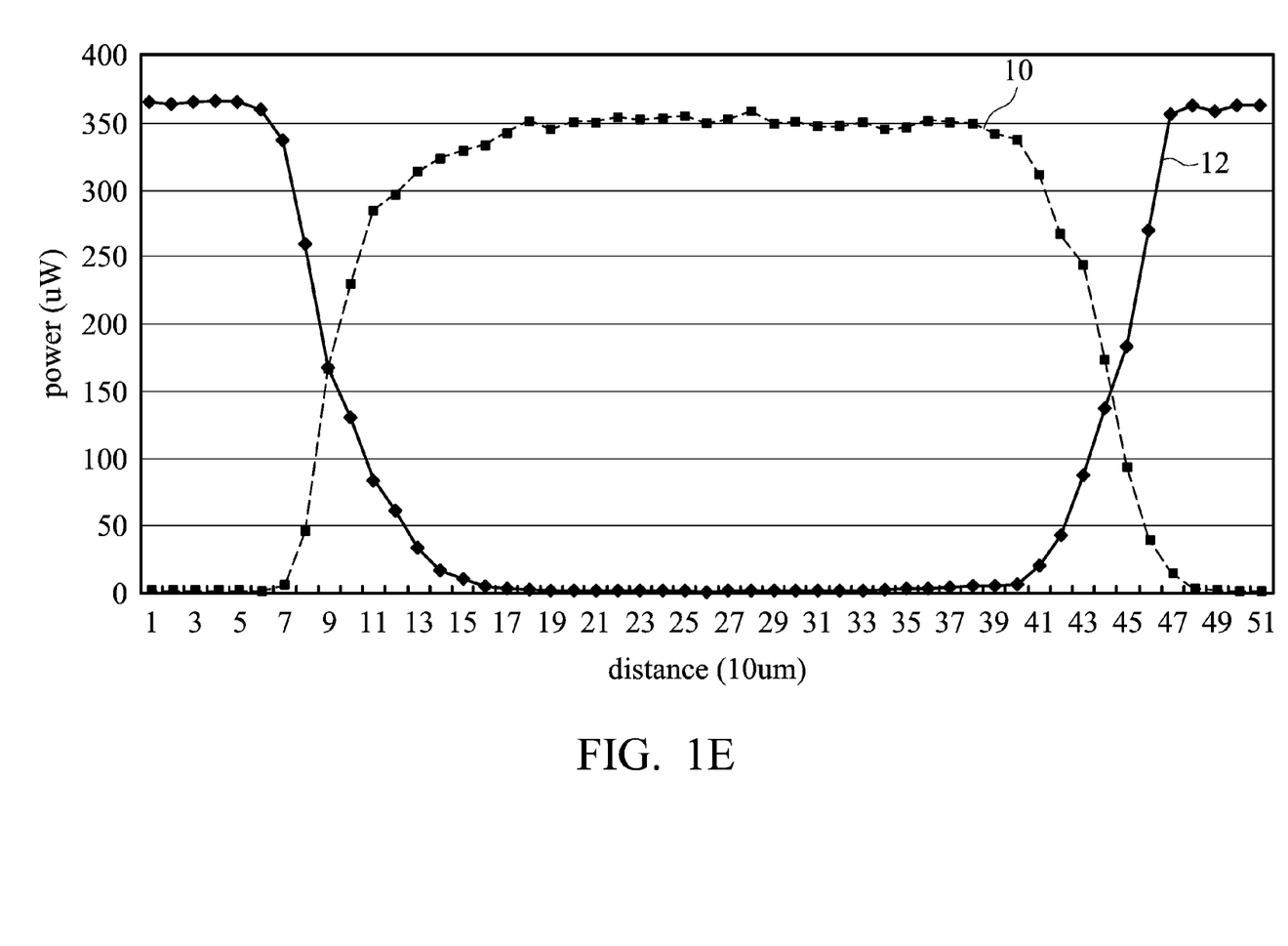
FIG. 1E illustrates transmittance of a phase retardation film (retarder) fabricated by one embodiment of an apparatus for fabricating patterns using a laser diode.

FIG. 1E illustrates transmittance of a phase retardation film (retarder) fabricated by one embodiment of an apparatus for fabricating patterns using a laser diode. The measurement of the transmittance comprises respectively disposing the phase retardation films between two polarizers having a phase change difference of 0° or 90° from each other to form two testing samples. Next, the two testing samples are irradiated by the light and measured the transmittance, respectively. A curve 10 illustrates transmittance of the phase retardation film sandwiched between two polarizers having a phase change difference of 90°. Also, a curve 10 illustrates transmittance of the phase retardation film sandwiched between two polarizers having a phase change difference of 0°. It is noted that a phase change difference between positions where the patterns are fabricated and other positions of the phase retardation film is 90°. Therefore, as shown by the curve 10, when the phase retardation film is between two polarizers having a phase change difference of 90°, the light may pass through positions where the patterns are fabricated and result in a high transmittance (about 350 μW). Similarly, as shown by the curve 10, when the phase retardation film between two polarizers have a phase change difference of 0°, the light may not pass through positions where the patterns are fabricated and result in a low transmittance (about 0.81 μW). A ratio between the high transmittance (about 350 μW) and the low transmittance (about 0.81 μW) of the phase retardation film is about 430. It is noted that the phase retardation film fabricated by one embodiment of an apparatus for fabricating patterns using a laser diode has a high contrast.

Figure 2A:
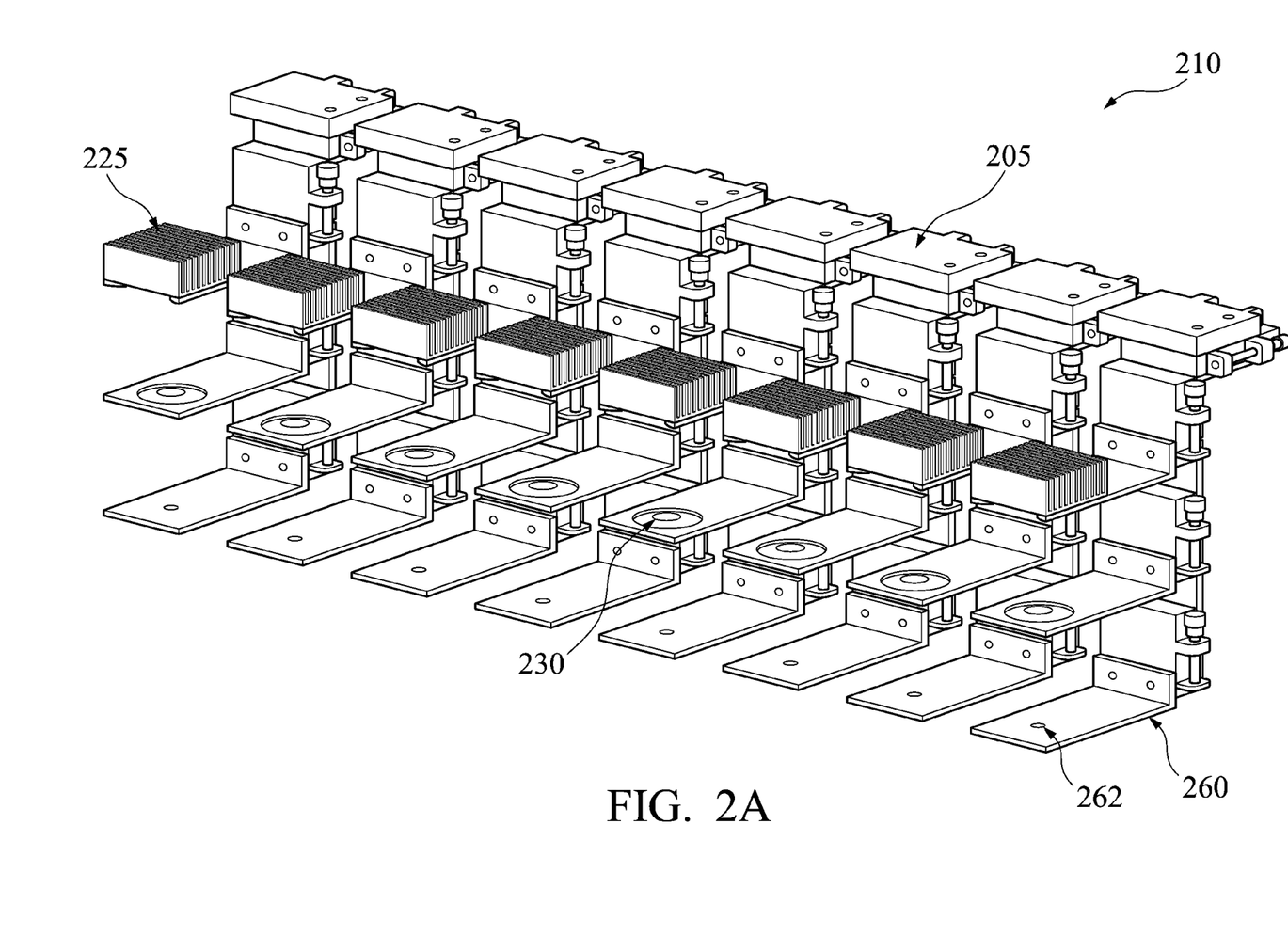
FIGS. 2A and 2B are schematic views illustrating one embodiment of a laser diode array structure of the disclosure.
Figure 2B:
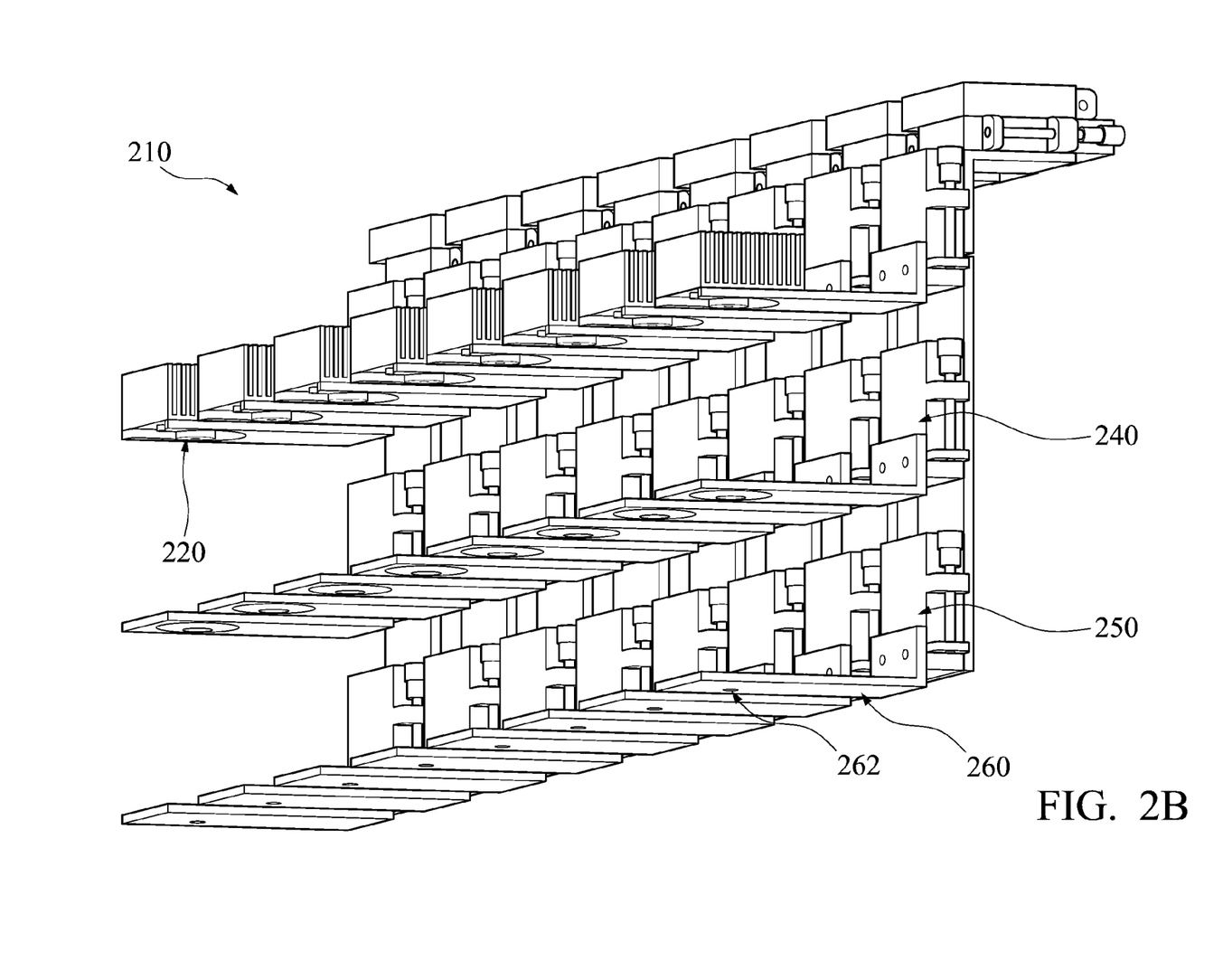

One embodiment of an apparatus for fabricating patterns may use a laser diode array to facilitate mass production. FIGS. 2A and 2B are schematic views illustrating one embodiment of a laser diode array structure. Referring to FIG. 2A, a laser diode array 210 can be a working module consisting of multiple independent laser diodes, such as a column of working modules with 8 staggered laser diodes. The wavelengths of each laser diode may be located within a near IR band or visible light band. Laser diodes 220 (as shown in FIG. 2B) of the laser diode array working module are fixed to an X-Y-Z axis micro gauge platform 205. A heat dissipation structure 225 or a heat sink is fixed to the other side of the laser diode 220 to pump out excess heat. A focus lens 230 is fixed to a Z-axis lens platform 240. A mask 260 having a pin hole 262 is optionally fixed to a Z-axis lens platform 250 connecting to the Z-axis lens platform 240. The X-Y-Z axis micro gauge platform 205 is an adjustment means to regulate pitches between each laser diode 220. In one embodiment, the distance between adjacent laser diodes is adjusted by the adjustment means. The entire laser diode array is rotated or tilted by the adjustment means. Additionally, the Z-axis lens platform 240 or 250 is an additional adjustment means for adjusting or moving a relative distance between each lens 230 and each laser diode 220 or each lens 230 and each mask 260. The additional adjustment means can also be used for moving the working piece (such as the first and the second material layers) or adjusting a relative distance between each lens and the first material layer. In other embodiments, the additional adjustment means is controlled by adjusting movement along the X, Y, and Z axes to regulate the relative distance between each lens and each laser diode such that each lens, each laser diode and each pin hole of each mask are aligned with the same axis and the same center.

Figure 3A:
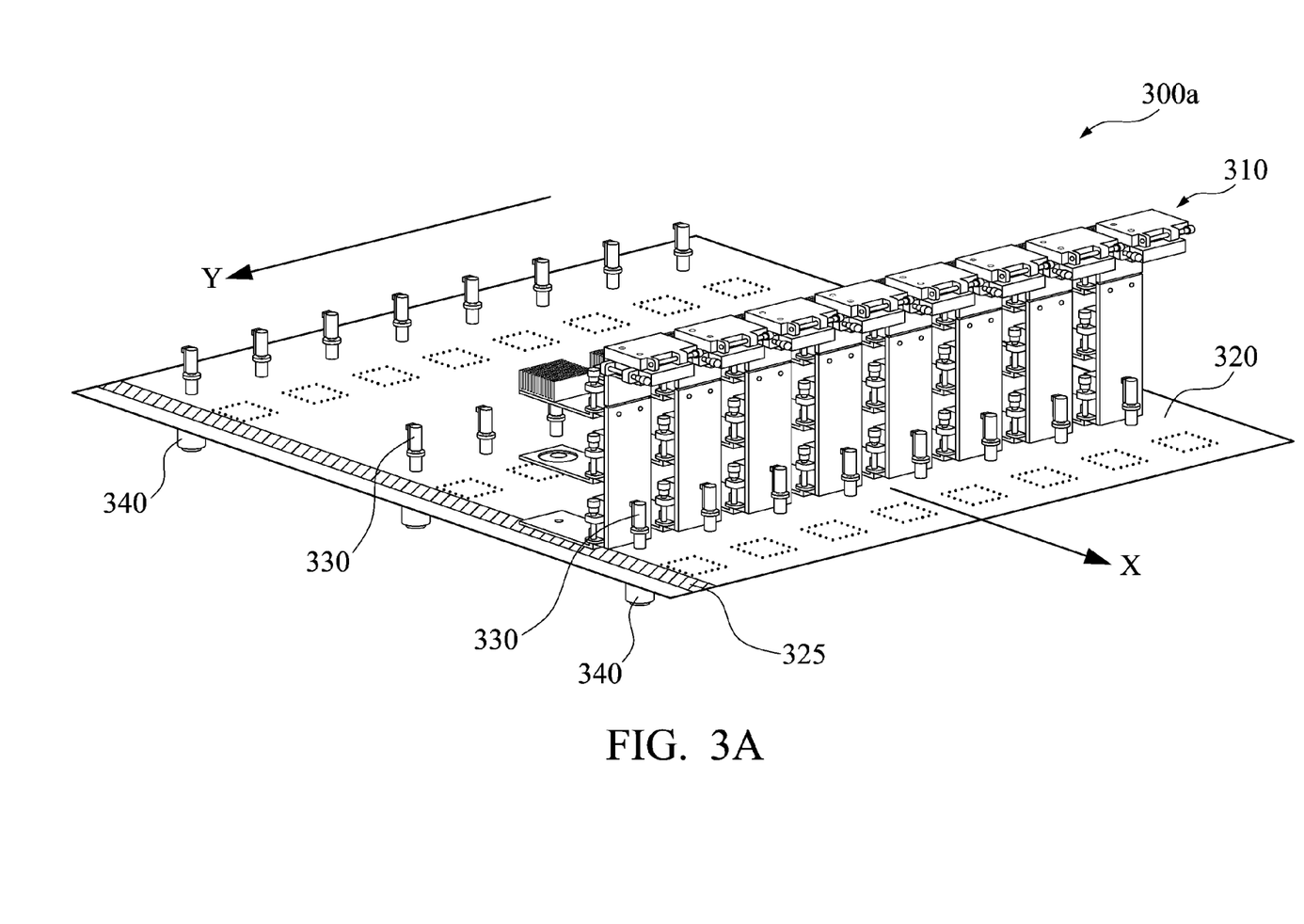
FIGS. 3A and 3B are schematic views illustrating another embodiment of an apparatus for fabricating patterns using a laser diode array of the disclosure.

In another embodiment, since the laser diode array possesses light weight, small size, and rearrangement characteristics, a material layer with patterns can be rapidly produced. FIG. 3A is a schematic view illustrating another embodiment of an apparatus 300a for fabricating patterns using a laser diode array. In another embodiment, two additional functions are further added to the laser diode array apparatus for fabricating patterns. One function is for checking transparent variation of the phase retardation film, while the other is for synchronously fabricating the micro retardation (μ-retarder) film. Referring to FIG. 3A, an apparatus 300a for fabricating patterns using a laser diode array includes a laser diode array 310, and a working piece 320 located underneath the laser diode array 310. A laser diode measuring light source 330 and a detector 340 are respectively disposed on both top and bottom sides of the working piece 320 to analyze phase variation of the patterns 325 when processing the working piece 320. In this embodiment, the measuring light source 330 and detector 340 are arranged in an array form. For example, the measuring light source and detector can be arranged in three columns or even closer as shown in FIG. 3A. When fabricating the patterns, the laser diode measuring light source moves along the Y-axis direction, while the working piece 320 moves along the X-axis direction. In another embodiment, the measuring light source 330 and detector 340 can be arranged in a single column form, integrated with the laser diode array 310 as shown as the laser diode array apparatus 300b for fabricating patterns in FIG. 3B. Note that the measuring light source 330 and detector 340 can compose at least one laser light analyzing system which is synchronously producing patterns and checking out the phase retardation variation of the patterns. Although some transmissive laser light analyzing systems (i.e., the measuring light source 330 and detector 340 are disposed on different sides of the working piece 320) are provided for implementing different features of various embodiments, these are merely examples and are not intended to be limiting. It should be understood that the measuring light source 330 and detector 340 can also be disposed on the same side of the working piece 320.

Figure 4A:
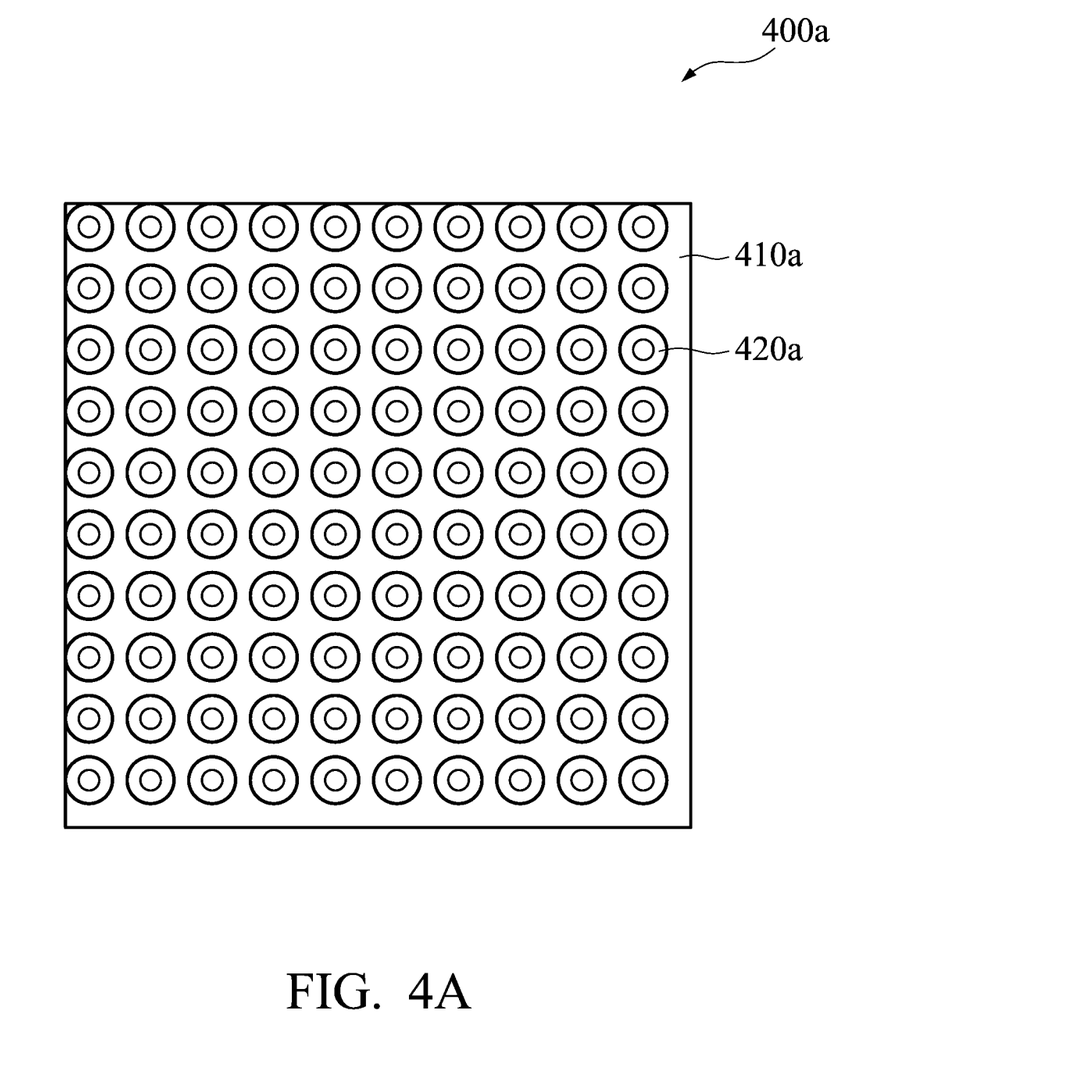
FIGS. 4A and 4B are schematic views illustrating one embodiment of the laser diode array structures of the disclosure.
Figure 4B:
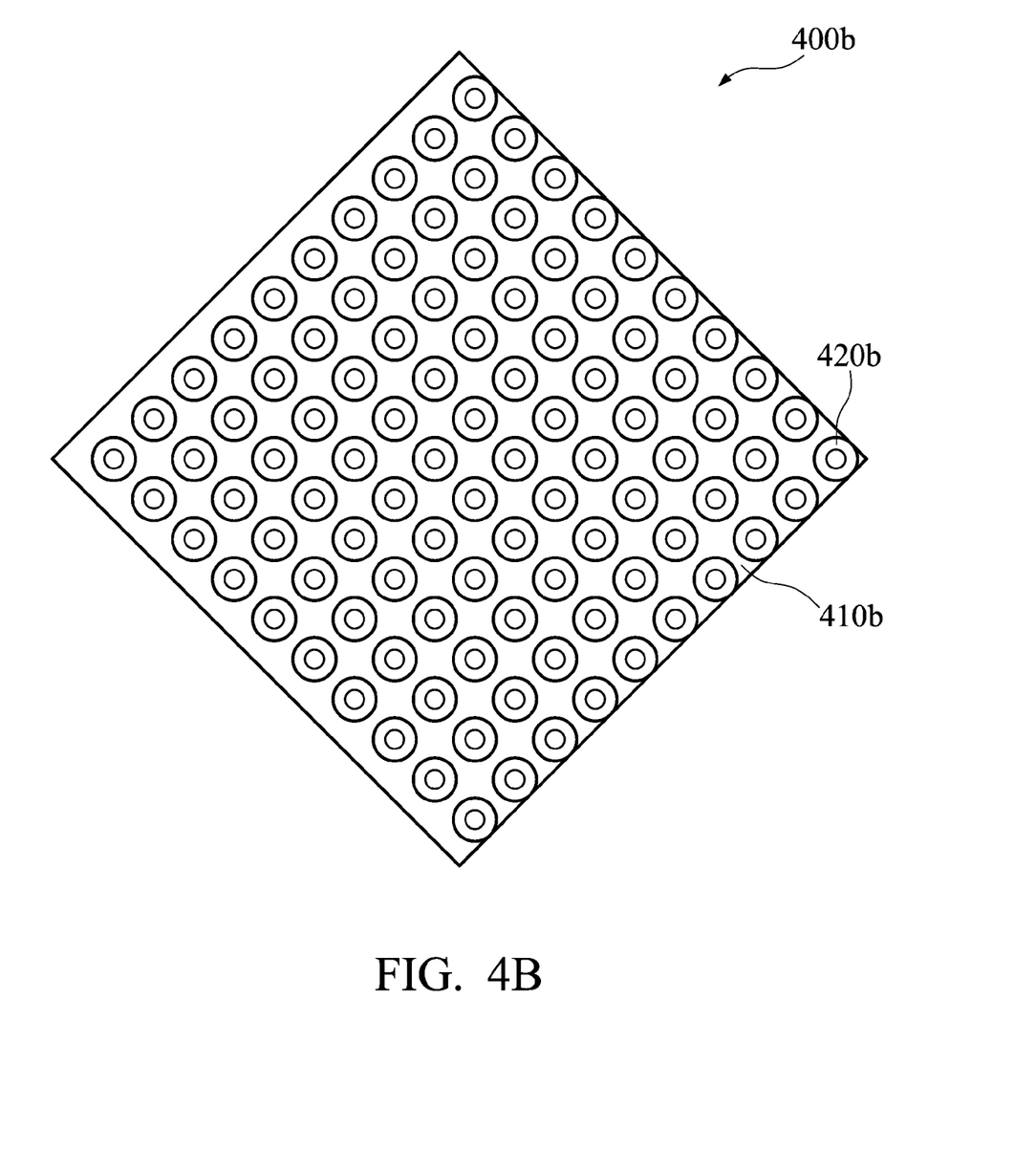

FIGS. 4A and 4B are schematic views illustrating one embodiment of the laser diode array structures. Referring to FIG. 4A, the laser diode array 400a can comprise a two-dimensional array (such as a square matrix or a rectangular matrix) consisting of multiple laser diodes 420a. The laser diode array 400a can be fixed to a frame 410a. Alternatively, referring to FIG. 4B, the laser diode array 400b can comprise a two-dimensional array (such as a rhombic square matrix or a rhombic rectangular matrix) consisting of multiple laser diodes 420b. In another embodiment, a rotation control means can be used to control rotated angles of the laser diode array 400a of FIG. 4A such that an interval between adjacent laser diodes can be controlled.

When fabricating the patterns using the laser diode array apparatus, each laser diode can be fixed to a mechanic robot for testing the laser diodes. The working pieces can be driven by the precision bearings motor to implement fabrication of patterns. Using the infrared (IR) light generated from laser diodes, the IR light is directly irradiated and focused on the laser absorption layer overlying the film to be patterned. Since the laser absorption layer possess characteristics of enduring high temperature, anti-reflection, and non-transmission, a light emitted from laser diodes can rapidly transform into heat energy, thereby forming patterns on the working pieces. Note that the apparatuses for fabricating patterns using a laser diode array can be incorporated with a precision bearings motor. The moving speed of the working pieces can be effectively controlled. A system for mass production and speedy fabrication of patterns is achieved by combination of the laser diode array apparatus and the precision bearings motor. Moreover, the laser diode array can be designed to scan line patterns with different pitches. In another embodiment, the laser absorption layer can be removed after implementation of the of laser diode processing process.

Figure 3B:
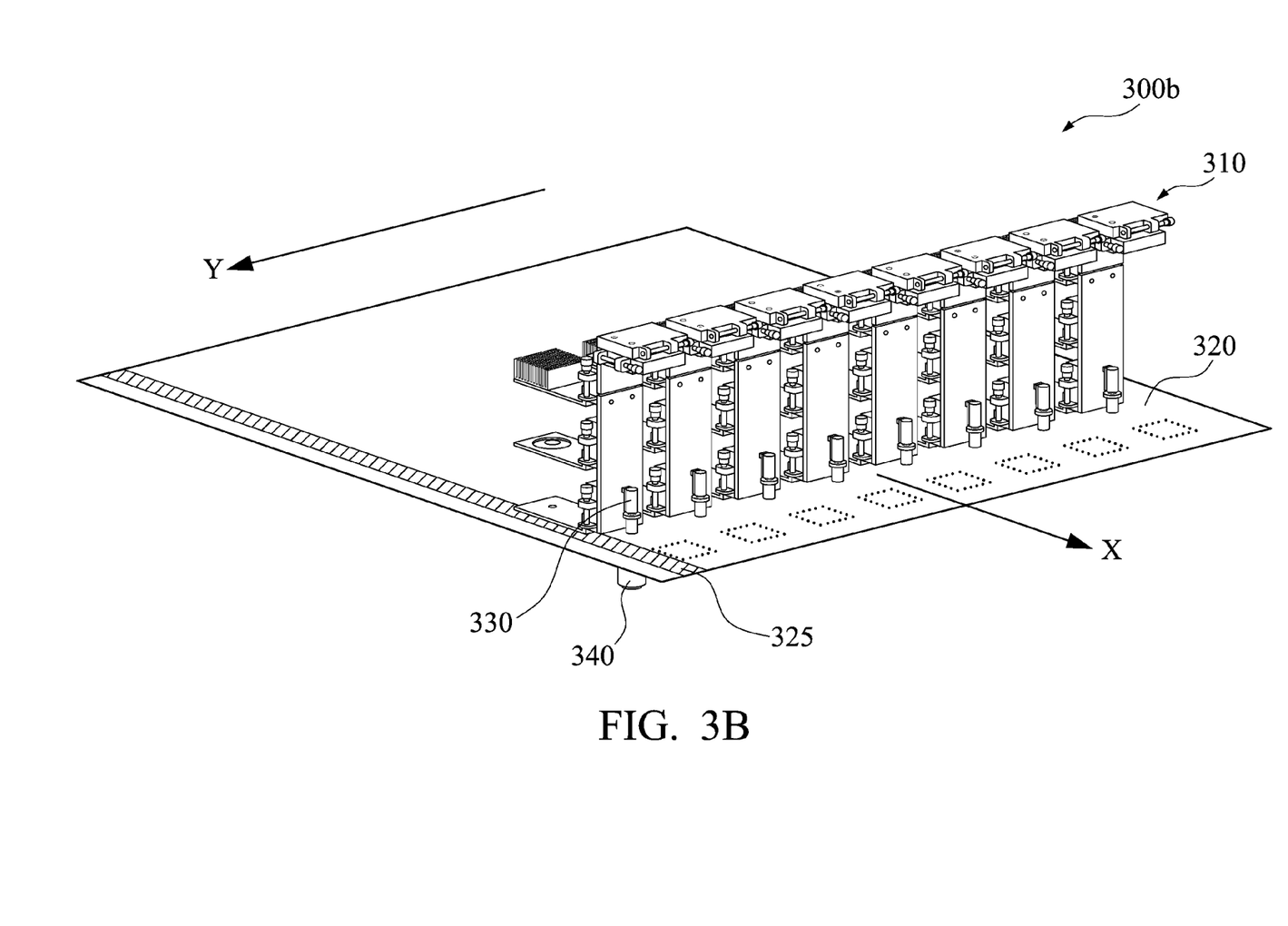

In another embodiment, since the laser diode array (as shown in FIGS. 3A and 3B) possesses light weight, small size, and rearrangement characteristics, a material layer with patterns can be rapidly produced. The above characteristics are very important and critical to fabricate large-sized patterns. The infrared light emitted from the laser diodes can directly pass through the lens (such as a convex lens) and the pin hole of the mask, and then be focused on the laser absorption layer overlying the film to be patterned. Note that the laser absorption layer has characteristics of enduring high temperature, anti-reflection, and non-transmission. The light emitted from laser diodes can therefore rapidly be transformed into heat energy. The laser absorption layer adhered on the film on which a micro pattern is desirably formed is originally used to prevent the film on which a micro pattern is desirably formed from being scratched or damaged. Another function, is that when the film to be patterned absorbs infrared light and transforms it into heat (for example raising the temperature to over 65° C.), the generated heat is transferred from the laser absorption layer to the underlying film. Stripe patterns (such as with phase retardation variations) can thus be formed on the film on which a micro pattern is desirably formed because the generated heat is transferred from the laser absorption layer thereto. Therefore, the laser absorption layer not only serves as a protective film, preventing scratching or damage, but also serves as a medium for transforming light energy to heat. After completing fabrication of patterns using the laser diode array, the laser absorption layer can be removed. Therefore, a material layer with patterns can be rapidly produced.

Further, in another embodiment, one principle aspect provides laser diodes (a laser diode array) set up to a testing robot of the laser diodes on the path of the patterned film (or the working pieces). The working pieces can be driven by a precision bearings motor to implement fabrication of patterns. By using the light generated from laser diodes, the light is directly irradiated and focused on the laser absorption layer overlying the film to be patterned. Since the laser absorption layer possesses characteristics of enduring high temperature, anti-reflection, and non-transmission, the light emitted from laser diodes can rapidly be transformed into heat energy, thereby forming patterns on the working pieces.

Embodiments of an apparatus for fabricating patterns using a laser diode or a laser diode array are provided by incorporating a laser diode with a laser absorption layer disposed on a film on which a micro pattern is desirably formed. Since the laser diode possesses characteristics of a small volume and low production costs and the laser absorption layer possesses characteristics of indirect heating, a micro phase retardation film can be produced. Embodiments of an apparatus for fabricating patterns using a laser diode may especially be incorporated with a mask with a pin hole, so that a diameter and intensity of light emitted from the laser diode is well controlled. The patterns may have improved contrast and diameter precision. Therefore, one embodiment of an apparatus for fabricating patterns using a laser diode is applied to directly fabricate a phase retardation film with high phase difference/contrast and a precise diameter on a display panel or a polarizer of a display panel Moreover, the pitch between adjacent laser diodes of embodiments of an apparatus for fabricating patterns using a laser diode array can be adjustable to fabricate stripe patterns with different pitches. Furthermore, the entire laser diode array is rotated or tilted (as shown in FIGS. 4A and 4B) for scanning with different line pitches. The apparatus for fabricating patterns using a laser diode array can be used to produce films with large scale patterns.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for fabricating patterns using a laser diode, comprising:
   a laser diode array comprising a plurality of laser diodes;
   a plurality of lenses disposed respectively corresponding to the plurality of laser diodes;
   a plurality of masks disposed respectively corresponding to the plurality of laser diodes, wherein each of the plurality of masks has a pin hole, arranged such that a light beam respectively emitted from each of the plurality of laser diodes sequentially passes through the lens and the pin hole corresponding thereto to be focused on a first material layer, wherein the first material layer is disposed on a second material layer; and
   an adjustment means, configured to regulate pitches between each of the plurality of laser diodes.

2. The apparatus for fabricating patterns as claimed in claim 1, wherein the first material layer is a laser absorption layer.

3. The apparatus for fabricating patterns as claimed in claim 1, further comprising a third material layer, wherein the second material layer is glued onto or electrostatically attached to the third material layer.

4. The apparatus for fabricating patterns as claimed in claim 1, wherein the first material layer is a perchlorate dye-containing layer.

5. The apparatus for fabricating patterns as claimed in claim 1, wherein the first material layer has a thickness of between about 500 Å and 2000 Å.

6. The apparatus for fabricating patterns as claimed in claim 1, wherein the second material layer is a film on which a micro pattern is desirably formed.

7. The apparatus for fabricating patterns as claimed in claim 1, wherein the second material layer is a phase retardation film.

8. The apparatus for fabricating patterns as claimed in claim 1, wherein the wavelengths of the laser diode are located within a near IR band or visible light band.

9. The apparatus for fabricating patterns as claimed in claim 1, wherein a distance between the mask and the first material layer is less than a distance between the mask and the lens.

10. The apparatus for fabricating patterns as claimed in claim 1, wherein a diameter of the pin hole is smaller than that of the light emitted from the laser diode.

11. The apparatus for fabricating patterns as claimed in claim 1, wherein the laser diode, the lens and the pin hole are aligned with the same axis and the same center.

12. An apparatus for fabricating patterns using a laser diode, comprising:
    a laser diode array comprising a plurality of laser diodes;
    a plurality of lenses disposed respectively corresponding to the plurality of the laser diodes, arranged such that light beams respectively emitted from each of the plurality of the laser diodes pass through the lens corresponding thereto to be focused onto a first material layer, and wherein the first material layer is disposed on a stack composed by a second material layer as a top layer, a third material layer as a middle layer and a fourth material layer as a bottom layer; and
    an adjustment means, configured to regulate pitches between each of the plurality of laser diodes.

13. The apparatus for fabricating patterns as claimed in claim 12, wherein the third material layer is a polarizer or a cholesteric liquid crystal plate.

14. The apparatus for fabricating patterns as claimed in claim 13, wherein a distance between the mask and the first material layer is less than a distance between the mask and the lens.

15. The apparatus for fabricating patterns as claimed in claim 13, wherein a diameter of the pin hole is smaller than that of the light emitted from the laser diode.

16. The apparatus for fabricating patterns as claimed in claim 12, wherein the adjustment means is further configured to adjust or move a relative distance between the lens and the laser diode or a relative distance between the lens and the stack.

17. The apparatus for fabricating patterns as claimed in claim 16, wherein the adjustment means is configured to adjust movement along the X, Y, and Z axes to regulate the relative distance between the lens and the laser diode.

18. The apparatus for fabricating patterns as claimed in claim 12, wherein the entire laser diode array is rotated or tilted by the adjustment means.

19. The apparatus for fabricating patterns as claimed in claim 12, further comprising at least one laser light analyzing system, synchronously producing patterns and checking out the phase retardation variations of the patterns.

20. The apparatus for fabricating patterns as claimed in claim 12, wherein the first material layer is a laser absorption layer.

21. The apparatus for fabricating patterns as claimed in claim 12, wherein the second material layer is a phase retardation film.

22. The apparatus for fabricating patterns as claimed in claim 12, wherein the fourth material layer is a liquid crystal display panel.

23. The apparatus for fabricating patterns as claimed in claim 12, further comprising a mask having at least one pin hole, wherein the laser diode, the lens and the pin hole are aligned with the same axis and the same center.

24. The apparatus for fabricating patterns as claimed in claim 12, wherein the stack is disposed on the base stage, wherein a movement of the stack is drive by at least one driving shaft controlled by a precision bearings motor, wherein the at least one driving shaft is configured to adjust the relative moving speed between the stack and the first material layer.

25. The apparatus for fabricating patterns as claimed in claim 12, wherein the lens and the laser diode are aligned with the same axis and the same center.

* * * * *